US007535293B2

(12) United States Patent
Jang

(10) Patent No.: US 7,535,293 B2
(45) Date of Patent: May 19, 2009

(54) PREAMPLIFIER CIRCUITS AND METHODS OF CALIBRATING AN OFFSET IN THE SAME

(75) Inventor: Young-Chan Jang, Daegu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 99 days.

(21) Appl. No.: 11/679,802

(22) Filed: Feb. 27, 2007

(65) Prior Publication Data

US 2007/0200619 A1 Aug. 30, 2007

(30) Foreign Application Priority Data

Feb. 28, 2006 (KR) .................. 10-2006-0019247

(51) Int. Cl.
*H03F 1/02* (2006.01)
(52) U.S. Cl. ........................................... 330/9
(58) Field of Classification Search ............ 330/9;
327/124, 307
See application file for complete search history.

(56) References Cited

U.S. PATENT DOCUMENTS 6,617,918 B2 * 9/2003 Casper ...................... 330/9
2006/0055577 A1 * 3/2006 Boemler .................... 341/155

FOREIGN PATENT DOCUMENTS

| JP | 2000-049592 | 2/2000 |
| KR | 2003-0063149 | 7/2003 |
| KR | 2003-0088322 | 11/2003 |

OTHER PUBLICATIONS

English language abstract of Korean Publication No. 2003-0063149.
English language abstract of Korean Publication No. 2003-0088322.
English language abstract of Japanese Publication No. 2000-049592.

* cited by examiner

*Primary Examiner*—Steven J Mottola
(74) *Attorney, Agent, or Firm*—Marger Johnson & McCollom, P.C.

(57) ABSTRACT

A preamplifier circuit includes a differential amplifying unit, an offset detection unit and a reference signal generation unit. The differential amplifying unit compares an input signal pair with a reference signal pair to generate an output signal pair. The offset detection unit detects an offset of the output signal pair received from the differential amplifying unit to generate a calibration signal in an offset calibration mode. The reference signal generation unit adjusts the reference signal pair based on the calibration signal, and the reference signal pair is fed-back to the differential amplifying unit.

25 Claims, 8 Drawing Sheets

PREAMPLIFIER CIRCUITS AND METHODS OF CALIBRATING AN OFFSET IN THE SAME

CROSS-REFERENCE TO RELATED APPLICATIONS

This application claims priority under 35 USC §119 to Korean Patent Application No. 10-2006-0019247, filed on Feb. 28, 2006 in the Korean Intellectual Property Office (KIPO), the disclosure of which is incorporated herein in its entirety by reference.

BACKGROUND OF THE INVENTION

1. Field of the Invention

The present invention relates to multi-level data transfer. More particularly, the present invention relates to a preamplifier circuit and a method of calibrating an offset in a preamplifier circuit.

2. Description of the Related Art

Recently, a parallel transfer mode of input/output data has been replaced with a high-speed serial transfer mode as the operation speed of memory systems has increased. In the parallel transfer mode, a low frequency clock may be used. But the parallel transfer mode has several problems, such as a cost increase due to an increase in the number of required pins, the complexity of routing, the presence of skew and jitter, among other problems. In the serial transfer mode, the cost may be decreased because fewer pins may be required. And the complexity of routing, skew, and jitter may be avoided. A high frequency clock, however, may be required for satisfying a high data transfer rate in the serial transfer mode. Thus, a solution for reducing power consumption and an interface for securing integrity of the transferred signal is needed.

To this end, methods of transferring multi-level input/output data at higher transfer rates have been introduced. One of the methods of transferring multi-level input/output data is pulse amplitude modulation (PAM), such as 2-PAM and 4-PAM. A symbol transfer rate of 4-PAM is a half of a symbol transfer rate of 2-PAM, even though 4-PAM maintains the same data transfer rate of 2-PAM. A receiving stage of 4-PAM requires three reference voltages, whereas a receiving stage of differential 2-PAM is self-referenced.

Generally, a multi-level receiving stage divides the received signal into respective levels using a differential preamplifier. A complementary metal oxide semiconductor (CMOS) differential preamplifier may have offsets resulting from mismatch of circuit constants (e.g., a capacitance and/or a resistance) depending on parameters of operation environments and/or manufacturing processes.

To calibrate a mismatch of a circuit constant, current flowing through an input transistor in the preamplifier may be controlled by adjusting a size of the input transistor. However, an increase in the size of the input transistor, for the purpose of eliminating offsets, can increase a capacitance at an output node. As a result, an output load may also increase, thereby limiting the transfer bandwidth.

SUMMARY OF THE INVENTION

Accordingly, example embodiments of the present invention are provided to substantially obviate one or more problems due to limitations and disadvantages of the related art.

Some example embodiments of the present invention provide a preamplifier circuit suitable for a multi-level pulse amplitude modulation (PAM), which substantially eliminates offsets of the reference signals without increasing an output load.

Some example embodiments of the present invention provide a method of calibrating offsets in a preamplifier circuit without increasing an output load, which is suitable for a multi-level PAM.

In one example embodiment of the present invention, a preamplifier circuit includes a plurality of differential amplifiers configured to compare at least one input signal pair to at least one reference signal pair, and to generate at least one output signal pair, an offset detection circuit configured to detect an offset of the at least one output signal pair, and to generate at least one calibration signal responsive to the detected offset, and a reference circuit configured to adjust the at least one reference signal pair responsive to the at least one calibration signal.

In another example embodiment of the present invention, a method for calibrating an offset in a preamplifier circuit comprises providing at least one input signal pair to a plurality of differential amplifiers, providing at least one reference signal pair to the plurality of differential amplifiers, generating at least one output signal pair responsive to the at least one input signal pair and responsive to the at least one reference signal pair, comparing signals of each of the at least one output signal pair to detect an offset during an offset detection mode, generating at least one calibration signal responsive to the comparison, and adjusting the at least one reference signal pair responsive to the at least one calibration signal.

Accordingly, offsets of reference signals may be calibrated without increasing an output load in a multi-level PAM. The foregoing and other features, objects, and advantages of the various example embodiments of the invention will become more readily apparent from the following detailed description, which proceeds with reference to the accompanying drawings.

DESCRIPTION OF THE EMBODIMENTS

Figure 1:
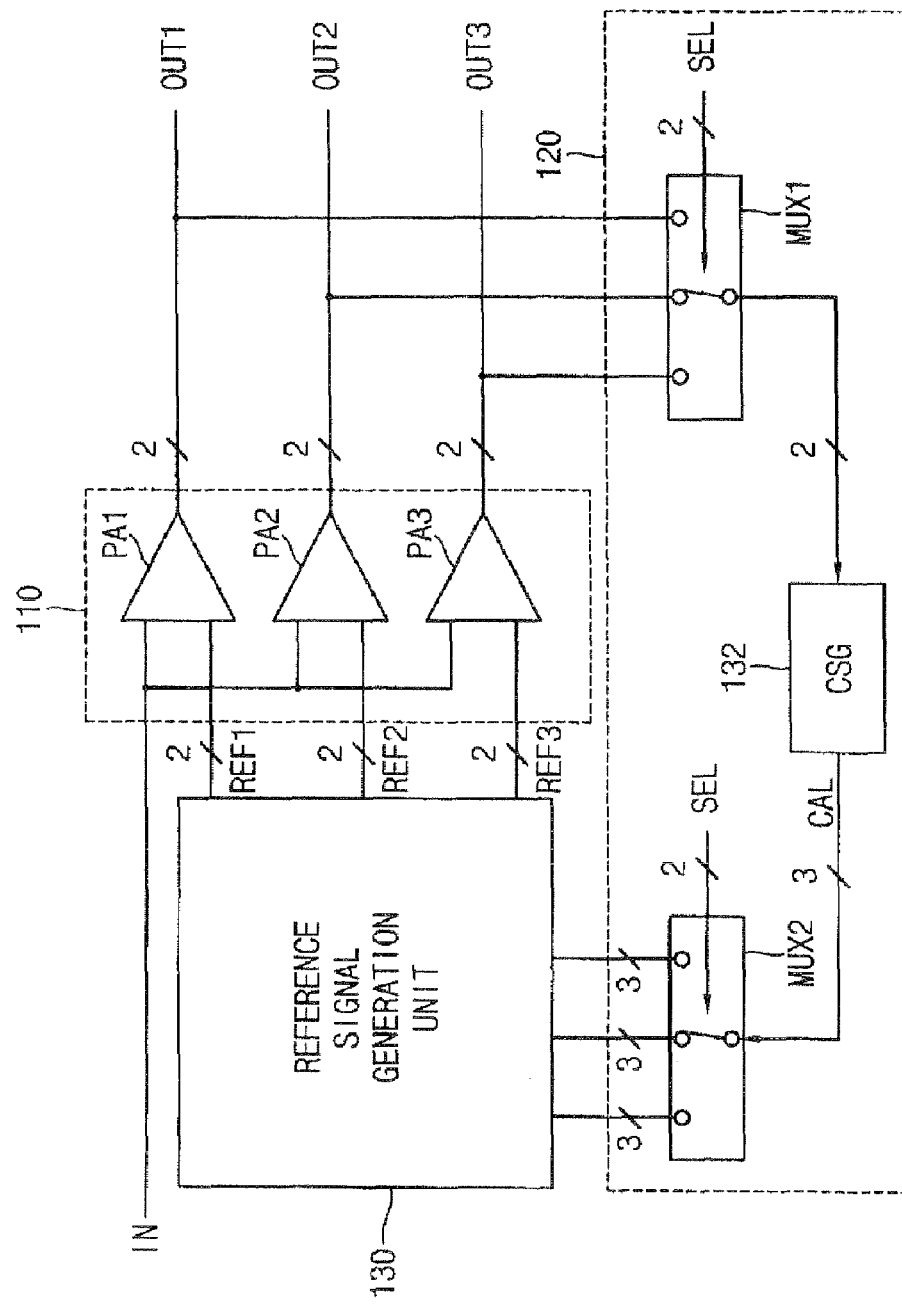
FIG. 1 shows a block diagram including a preamplifier circuit of a semiconductor device according to an example embodiment of the present invention.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a block diagram including a preamplifier circuit of a semiconductor device according to an example embodiment of the present invention. Referring to FIG. 1, the preamplifier circuit 100 includes a differential amplifying unit 110, an offset detection unit 120, and a reference signal generation unit 130.

The differential amplifying unit 110 may include three differential preamplifiers PA1~PA3 when the preamplifier circuit 100 has a 4-PAM input/output interface. Each differential preamplifier—PA1, PA2, and PA3—compares an input signal pair IN with reference signal pairs REF1~REF3, respectively, and generates output signal pairs OUT1~OUT3.

The offset detection unit 120 may include multiplexers MUX1, MUX2, and a calibration signal generation unit CSG. The offset detection unit 120 sequentially selects differential preamplifiers PA1, PA2, and PA3 responsive to selection signals of the multiplexers MUX1 and MUX2. The offset detection unit 120 detects an offset of the selected differential amplifier, and generates calibration signal CAL for eliminating the detected offset.

The reference signal generation unit 130 provides the reference signal pairs REF1~REF3 to the preamplifiers PA1~PA3 based in part on the calibration signal CAL. The reference signal generation unit 130 will be described later in detail with reference to FIGS. 6 through 9.

Figure 2:
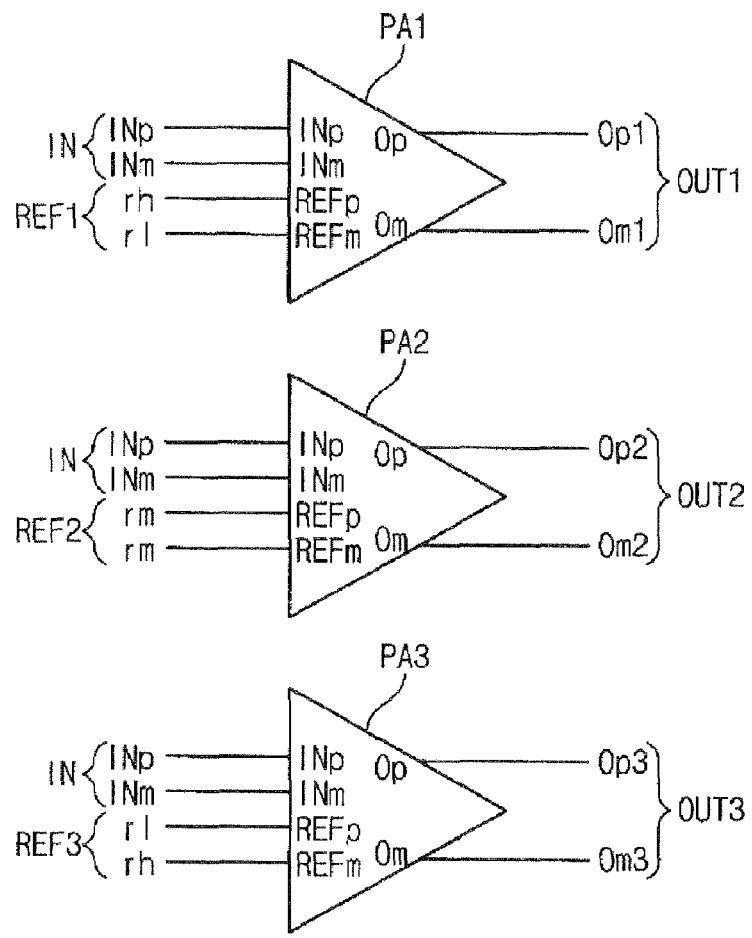
FIG. 2 shows a diagram including input and output terminals of the differential preamplifiers of FIG. 1.
Figure 3:
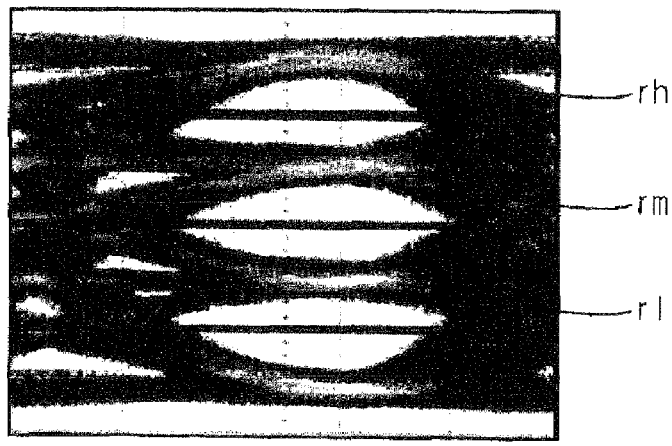
FIG. 3 shows a diagram including an eye-pattern of an input pair with respect to levels of reference signals.

FIG. 2 shows a diagram including input and output terminals of the differential preamplifiers of FIG. 1. FIG. 3 shows a diagram including an eye-pattern of an input pair with respect to levels of reference signals.

Referring to FIG. 2, input terminals INp and INm of the preamplifier PA1 receive the input signal pair INp and INm, respectively, where p represents plus and m represents minus. Input terminals REFp and REFm of the preamplifier PA1 receive the reference signal pair rh and rl, respectively. The preamplifier PA1 detects a signal of a higher level based on the reference signal rh as shown in FIG. 3.

Input terminals INp and INm of the preamplifier PA2 receive the input signal pair INp and INm, respectively, and input terminals REFp and REFm of the preamplifier PA2 receive the reference signal pair rm and rm, where m represents medium. The preamplifier PA2 detects a signal of a medium level based on the reference signal rm as shown in FIG. 3.

Input terminals INp and INm of the preamplifier PA3 receive the input signal pair INp and INm, respectively, and input terminals REFp and REFm of the preamplifier PA3 receive the reference signal pair rl and rh respectively. The preamplifier PA3 detects a signal of a lower level based on the reference signal rl as shown in FIG. 3.

Figure 4:
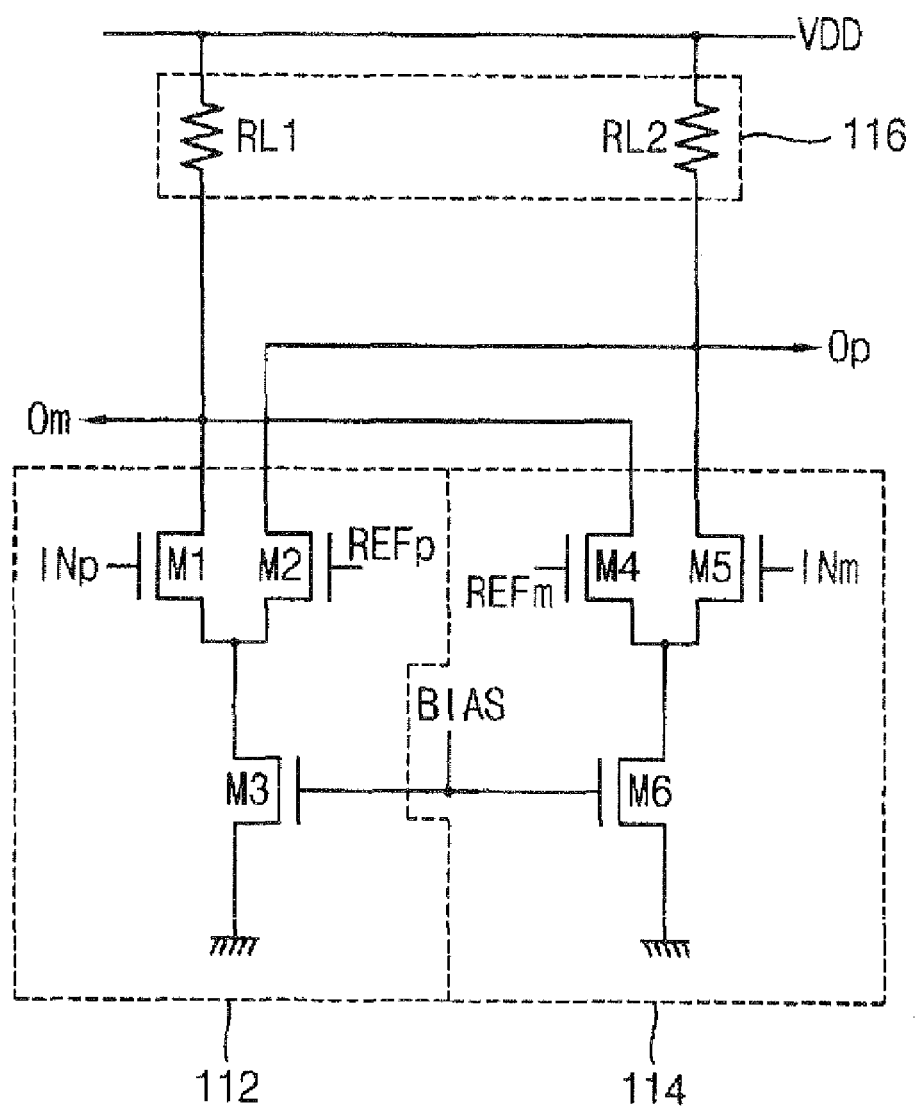
FIG. 4 shows a circuit diagram including an example embodiment of the respective preamplifiers of FIG. 2.

FIG. 4 shows a circuit diagram including an example embodiment of the respective preamplifiers of FIG. 2. Referring to FIG. 4, a preamplifier PA may include a first differential comparator 112, a second differential comparator 114, and an output unit 116.

The first differential comparator 112 may include NMOS transistors M1, M2 and M3. A source of the transistor M1 is coupled to a source of the transistor M2. A drain of the transistor M1 is coupled to a minus output terminal Om, and a drain of the transistor M2 is coupled to a plus output terminal Op. A gate of the transistor M1 is coupled to a plus input terminal INp, and a gate of the transistor M2 is coupled to a plus reference input terminal REFp. A drain of the transistor M3 is coupled to the common sources of the transistor M1 and M2. A gate of the transistor M3 receives bias voltage, and a source of the transistor M3 is coupled to a ground.

The second differential comparator 114 may include NMOS transistors M4, M5 and M6. A source of the transistor M4 is coupled to a source of the transistor M5. A drain of the transistor M4 is coupled to the minus output terminal Om, and a drain of the transistor M5 is coupled to the plus output terminal Op. A gate of the transistor MS is coupled to the minus input terminal INm, and a gate of the transistor M4 is coupled to a minus reference input terminal REFm. A drain of the transistor M6 is coupled to the common sources of the transistor M4 and M5. A gate of the transistor M6 receives bias voltage, and a source of the transistor M6 is coupled to the ground.

The output unit 116 may include a resistor RL1 coupled between a power voltage VDD and the minus output terminal Om, and a resistor RL2 coupled between the power voltage VDD and the plus output terminal Op. An output signal pair of the preamplifier PA may have a high state when a level of a positive input signal (e.g., INp) is higher than a level of a positive reference signal (e.g., REFp), and a level of a negative input signal (e.g., INm) is lower than a level of a negative reference signal (e.g., REFm).

Figure 5:
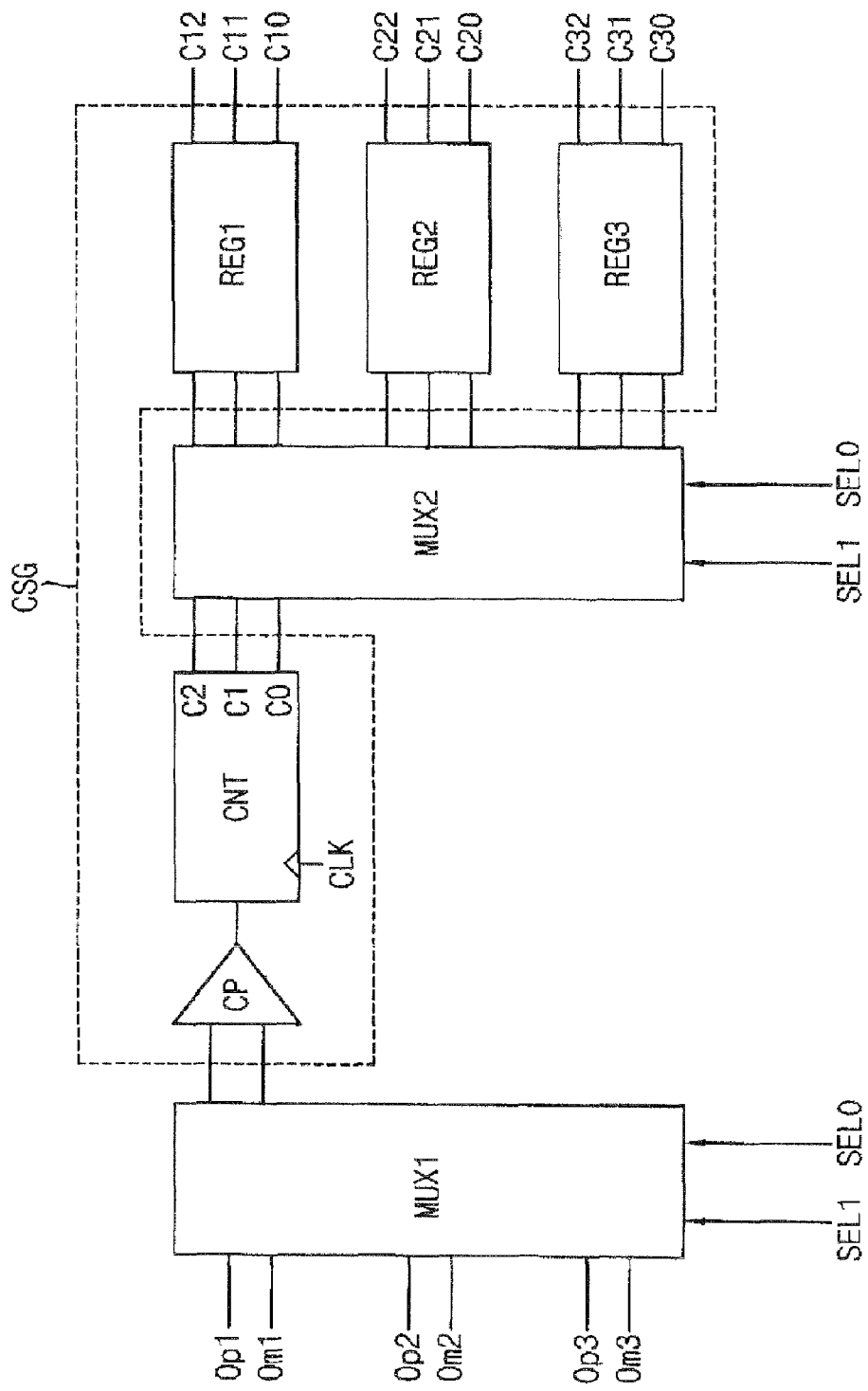
FIG. 5 shows a circuit diagram including the offset detection unit of FIG. 1.

FIG. 5 shows a circuit diagram including the offset detection unit of FIG. 1. Referring to FIG. 5, the offset detection unit 120 may include multiplexers MUX1 and MUX2, and the calibration signal generation unit CSG. The multiplexer MUX1 selects one of the output signal pairs (Op1, Om1), (Op2, Om2) and (Op3, Om3) based on the selection signals SEL0 and SEL1. The multiplexer MUX1 may sequentially output the signal pairs (Op1, Om1), (Op2, Om2) and (Op3, Om3) by sequentially changing the selection signal SEL0 and SEL1. The multiplexer MUX2 selects a calibration signal to be provided to the reference signal generation unit responsive to the selection signals SEL0, SEL1.

The calibration signal generation unit CSG may include a comparator CP, a counter CNT, and registers REG1, REG2, and REG3. The comparator CP may receive one of the output signal pairs (Op1, Om1), (Op2, Om2), and (Op3, Om3) of the preamplifier PA through the multiplexer MUX1, and may output amplified signal pairs that swing between the power voltage VDD and the ground voltage VSS. The counter CNT counts a clock signal CLK while the output signal pair of the comparator is in a high state. When the comparator outputs the signal pair in a low state, the counter CNT stops counting the clock signal CLK and the counted value is stored in the corresponding register REG1, REG2 or REG3. Thus, an output of the counter CNTF changes continuously while the output of the comparator CP is in a high logic state. The registers REG1, REG2, and REG3 are coupled to the multiplexer MUX2 and store the output of the counter CNT. The registers may output the stored value as calibration signals C10, C11, C12, C20, C21, C22, C30, C31, C32. The registers REG1, REG2, and REG3 maintain the finally counted value by the counter CNT.

Figure 6:
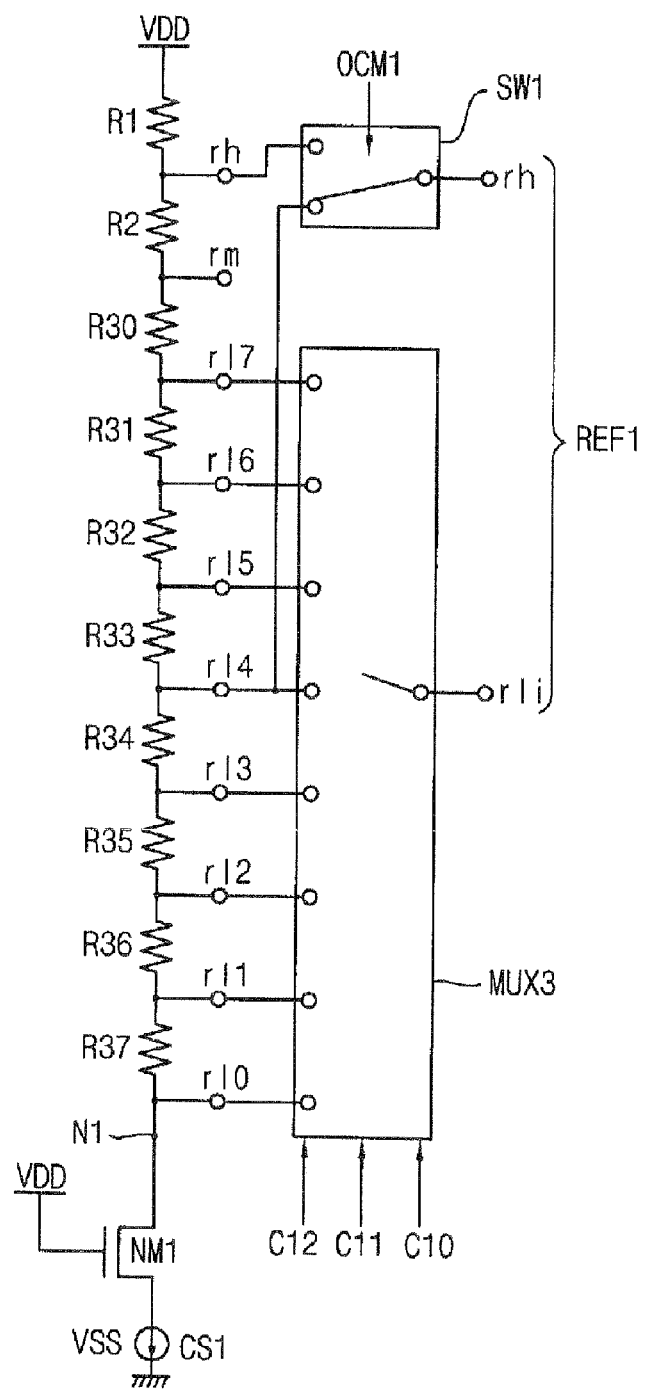
FIGS. 6 through 8 show circuit diagrams for describing operations of example embodiments of the reference signal generation unit of FIG. 1.
Figure 7:
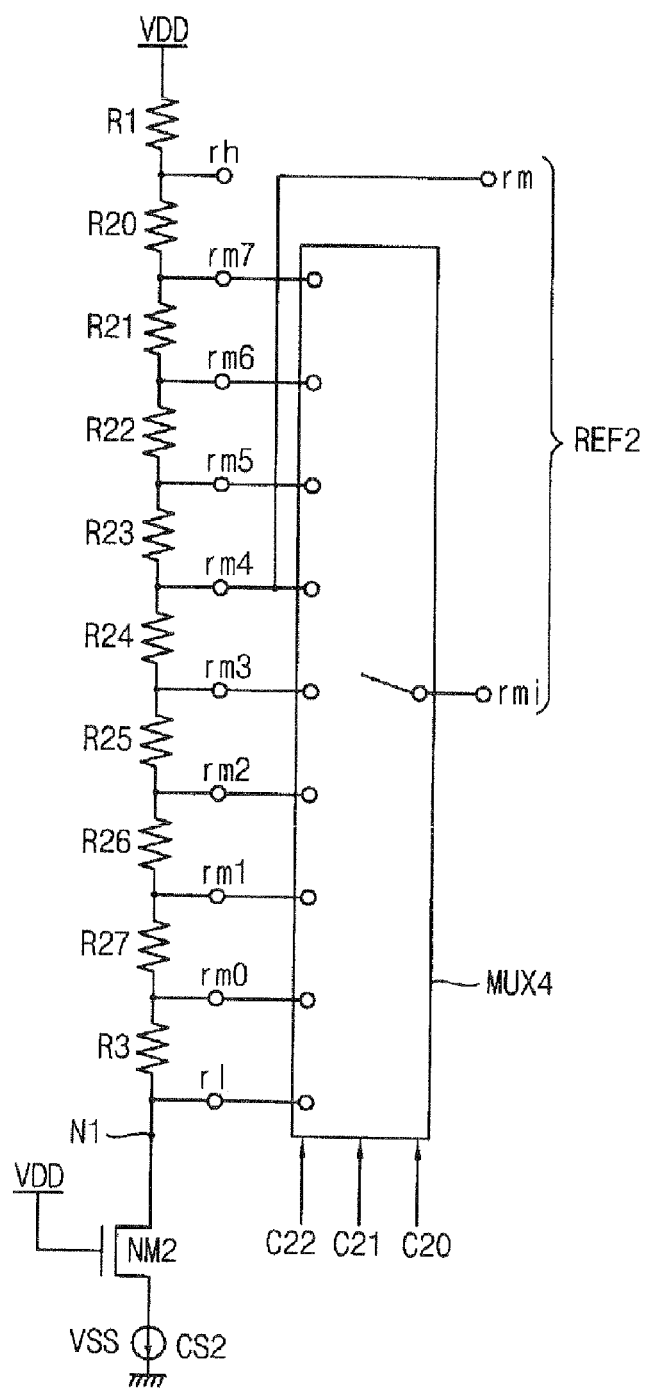
Figure 8:
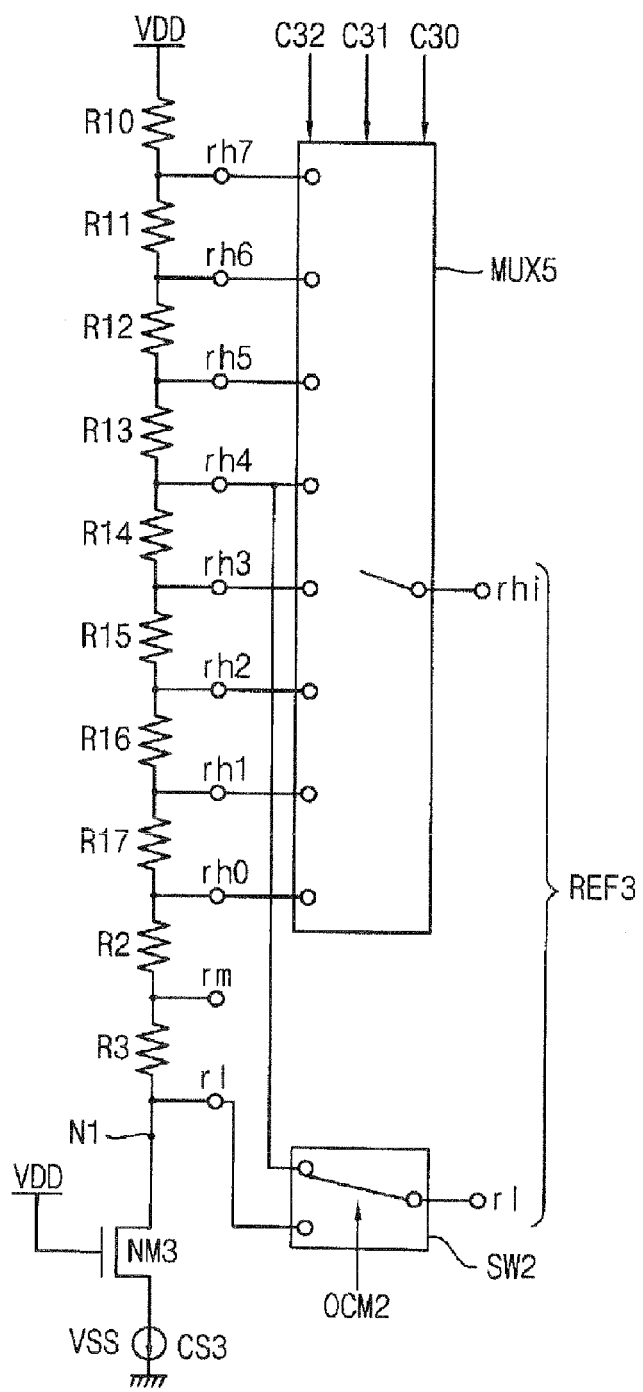

FIGS. 6 through 8 show circuit diagrams for describing operations of example embodiments of the reference signal generation unit of FIG. 1. The reference signal generation unit 130 in FIG. 1 may include a plurality of resistors coupled between a first power voltage VDD and a node N1, and a current source coupled between the node N1 and a second power voltage VSS.

FIG. 6 shows a circuit diagram 132 of an example embodiment of the reference signal generation unit of FIG. 1. The reference signal generation unit 132 may include resistors R1, R2, and R30 through R37, a NMOS transistor NM1, a current source CS1, a switch SW1 and a multiplexer MUX3. The multiplexer MUX3 may select, responsive to the calibration signal (C10, C11, and C12), one of a low reference signal rl0 through rl7—the low reference signals being divided by resistors R30 through R37. The 3-bit calibration signal (C10, C11, and C12) may be provided from the register REG1 (of FIG. 5). The switch SW1 may select rh in a normal mode, and may select rl4 in an offset calibration mode responsive to an offset calibration mode signal OCM1. The offset calibration mode signal OCM1 may maintain logic high in the offset calibration mode, and may maintain logic low in the normal mode.

The reference signal generation unit 132 may generate a reference signal pair REF1 comprised of a signal rl4 and a signal rli (selected by the multiplexer MUX3) in the offset calibration mode. The reference signal pair REF1 may then be provided to the preamplifier PA1 (of FIG. 1). The signal rli of the reference signal pair REF1 may be calibrated to eliminate an offset. When the calibration is finished, the multiplexer MUX3 is fixed to output the signal rli corresponding to the last value of C10, C11 and C12 stored in the register REG1 (of FIG. 5). The switch SW1 may return to the normal mode, and may select the signal rh when the offset calibration mode signal OCM1 transitions to logic low after the calibration is finished.

FIG. 7 shows a circuit diagram 134 of an example embodiment of the reference signal generation unit of FIG. 1. The reference signal generation unit 134 may include resistors R1, R20 through R27, and R3. The reference signal generation unit 134 may also include a NMOS transistor NM2, a current source CS2, and a multiplexer MUX4. The multiplexer MUX4 may select, responsive to the calibration signal (C20, C21, and C22), one of a medium reference signal rm0 through rm7—the medium reference signals being divided by resistors R20 through R27. The 3-bit calibration signal (C20, C21, and C22) may be provided from the register REG2 (of FIG. 5).

The reference signal generation unit 134 may generate a reference signal pair REF2 comprised of a signal rm4 and a signal rmi (selected by the multiplexer MUX4) in the offset calibration mode. The reference signal generation unit 134 may then provide the signal REF2 to the preamplifier PA2 (of FIG. 1). The signal rmi of the reference signal pair REF2 may be calibrated to eliminate the offset.

FIG. 8 shows a circuit diagram 136 of an example embodiment of the reference signal generation unit of FIG. 1. The reference signal generation unit 136 may include resistors R10 through R17, R2, and R3. The reference signal generation unit 136 may also include NMOS transistor NM3, a current source CS3, a switch SW2, and a multiplexer MUX5. The multiplexer MUX5 may select, responsive to the calibration signal (C30, C31, and C32), one of a high reference signal rh0 through rh7—the high reference signals being divided by resistors R10 through R17. The 3-bit calibration signal (C30, C31, and C32) maybe provided from a register REG3 (of FIG. 5). The switch SW2 may select rl in the normal mode, and may select rh4 in the offset calibration mode responsive to an offset calibration mode signal OCM2. The offset calibration mode signal OCM2 may maintain logic high in the offset calibration mode, and may maintain logic low in the normal mode.

The reference signal generation unit 136 may generate a reference signal pair REF3 comprised of a signal rh4 and a signal rhi (selected by the multiplexer MUX5) in the offset calibration mode. The reference signal pair REF3 may then be provided to the preamplifier PA3 (of FIG. 1). The signal rhi of the reference signal pair REF3 may be calibrated to eliminate the offset. When the calibration is finished, the multiplexer MUX5 is fixed to output the signal rhi corresponding to the last value of C30, C31 and C32 stored in the register REG3 (of FIG. 5). The switch SW2 may return to the normal mode, and may select the signal rl, when the offset calibration mode signal OCM2 transitions to logic low after the calibration is finished.

Hereinafter, operations of the preamplifier circuit of FIG. 1 will be described in detail by making reference to various components of the various figures. The signal rh (of FIGS. 6 and 7) may correspond to the signal rh4 (of FIG. 8), the signal rm (of FIGS. 6 and 8) may correspond to the signal rm4 (of FIG. 7), and the signal rl (of FIGS. 7 and 8) may correspond to the signal rl4 (of FIG. 6). The two input signals (INp and INm) of the input signal pair may be set to a medium reference voltage level Vref_mid for detecting the offset of the preamplifiers PA1, PA2, and PA3 (of FIG. 1).

The multiplexers MUX1 and MUX2 (of FIG. 1) are controlled based on the selection signals SEL0 and SEL1 (of FIG. 5) so that the preamplifier PA1 (of FIG. 1) and the reference generation unit 132 (of FIG. 6) can be selected. The switch SW1 (of FIG. 6) may select the signal rl4 (of FIG. 6) responsive to the offset detection mode signal OCM1 (of FIG. 6) in the offset detection mode. Thus, the signal rl4 and rli may be selected as the reference signal pair through the multiplexer MUX3 (of FIG. 6). The signal rli may be determined according to the calibration signal (C10, C11, and C12) stored in the register REG1 (of FIG. 5).

The output signal pair Op1 and Om1 (of FIG. 2) may be provided to the comparator CP (of FIG. 5) through the multiplexer MUX1 (of FIG. 5). When the comparator CP outputs a signal in a high state, the counter CNT (of FIG. 5) may increase a count value. The increased count value may be stored in register REG1 (of FIG. 5) through the multiplexer MUX2 (of FIG. 5). Thus, the calibration signal (C10, C11, and C12) may be changed. The multiplexer MUX3 (of FIG. 6) may select the signal rli (of FIG. 6) responsive to the calibration signal (C10, C11, and C12). The counter CNT (of FIG. 5) may repeat the count operation responsive to a clock signal CLK (of FIG. 5). When the output of the preamplifier PA1 (of FIG. 1) transitions from a high state to a low state, the counter CNT (of FIG. 5) stops counting, and a final count value stored in the register REG1 (of FIG. 5) is maintained. The final count value corresponds to a calibrated value for eliminating the offset of the preamplifier PA1 (of FIG. 1). When a reference signal rli (of FIG. 6) is determined by the calibration signal, an offset calibration of the preamplifier PA1 (of FIG. 1) may be completed.

The multiplexers MUX1 and MUX2 (of FIG. 1) are controlled based on the selection signals SEL0 and SEL1 (of FIG. 5) so that the preamplifier PA2 (of FIG. 1) and the reference generation unit 134 (of FIG. 7) can be selected. Thus, the signal rm4 and rmi may be selected as the reference signal pair through the multiplexer MUX4 (of FIG. 7). The signal rmi may be determined according to the calibration signal (C20, C21, and C22) stored in the register REG2 (of FIG. 5).

The output signal pair Op2 and Om2 (of FIG. 2) may be provided to the comparator CP (of FIG. 5) through the multiplexer MUX1 (of FIG. 5). When the comparator CP outputs a signal in a high state, the counter CNT (of FIG. 5) may increase a count value. The increased count value may be stored in register REG2 (of FIG. 5) through the multiplexer MUX2 (of FIG. 5). Thus, the calibration signal (C10, C11, and C12) may be changed. The multiplexer MUX4 (of FIG. 7) may select the signal rmi (of FIG. 7) responsive to the calibration signal (C20, C21, and C22). The counter CNT (of FIG. 5) may repeat the count operation responsive to a clock signal CLK (of FIG. 5). When the output of the preamplifier PA2 (of FIG. 1) transitions from a high state to a low state, the counter CNT (of FIG. 5) stops counting, and a final count value stored in the register REG2 (of FIG. 5) is maintained. The final count value corresponds to a calibrated value for eliminating the offset of the preamplifier PA2 (of FIG. 1). When a reference signal rmi (of FIG. 7) is determined by the calibration signal, an offset calibration of the preamplifier PA2 (of FIG. 1) may be completed.

The multiplexers MUX1 and MUX2 (of FIG. 1) are controlled based on the selection signals SEL0 and SEL1 (of FIG. 5) so that the preamplifier PA3 (of FIG. 1) and the reference generation unit 136 (of FIG. 8) can be selected. The switch SW (of FIG. 8) may select the signal rh4 (of FIG. 8) responsive to the offset detection mode signal OCM2 (of FIG. 8) in the offset detection mode. Thus, the signal rh4 and rhi may be selected as the reference signal pair through the multiplexer MUX5 (of FIG. 8). The signal rhi may be determined according to the calibration signal (C30, C31, and C32) stored in the register REG3 (of FIG. 5).

The output signal pair Op3 and Om3 (of FIG. 2) may be provided to the comparator CP (of FIG. 5) through the multiplexer MUX1 (of FIG. 5). When the comparator CP outputs a signal in a high state, the counter CNT (of FIG. 5) may increase a count value. The increased count value is stored in register REG3 (of FIG. 5) through the multiplexer MUX2 (of FIG. 5). Thus, the calibration signal (C30, C31, and C32) may be changed. The multiplexer MUX5 (of FIG. 8) may select the signal rhi (of FIG. 8) responsive to the calibration signal (C30, C31, and C32). The counter CNT (of FIG. 5) may repeat the count operation responsive to a clock signal CLK (of FIG. 5). When the output of the preamplifier PA3 (of FIG. 1) transitions from a high state to a low state, the counter CNT (of FIG. 5) stops counting, and a final count value stored in the register REG3 (of FIG. 5) is maintained. The final count value corresponds to a calibrated value for eliminating the offset of the preamplifier PA3 (of FIG. 1). When a reference signal rhi (of FIG. 8) is determined by the calibration signal, an offset calibration of the preamplifier PA3 (of FIG. 1) may be completed.

Even though an offset is eliminated by calibrating minus reference signals of each preamplifier according to the above example embodiments, plus reference signals may also be calibrated to eliminate the offset.

Figure 9:
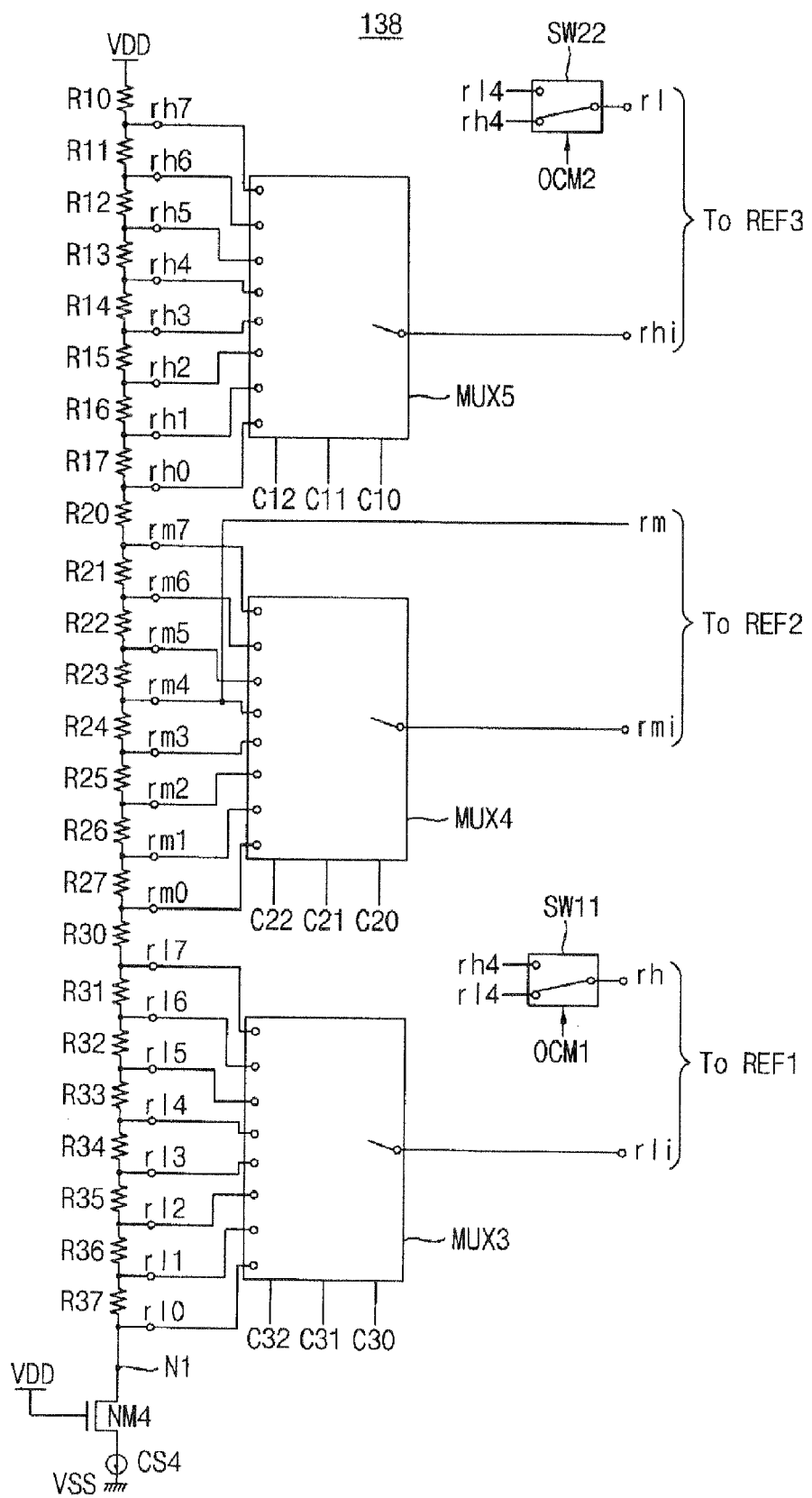
FIG. 9 shows a circuit diagram including an example embodiment of the reference signal generation unit of FIG. 1.

FIG. 9 shows a circuit diagram including an example embodiment of the reference signal generation unit of FIG. 1. The reference signal generation unit 138 may have a resistor string including the three resistor strings of FIGS. 6, 7, and 8 integrated together. As shown in FIG. 9, the switch SW11 receives the signal rh4 (a medium value of the signal rhi) whereas the switch SW1 (of FIG. 6) receives the signal rh (of FIG. 6). Similarly, the switch SW22 receives the signal rl4 (a medium value of the signal rli) whereas the switch SW2 (of FIG. 8) receives the signal rl (of FIG. 8). Thus, the switch SW11 may select rh4 in the normal mode, and may select rl4 in the offset calibration mode responsive to the offset calibration mode signal OCM1. And the switch SW22 may select rl4 in the normal mode, and may select rh4 in the offset calibration mode responsive to the offset calibration mode signal OCM2. The operations of the multiplexers MUX3, MUX4, and MUX5 and the switches SW11 and SW22 are substantially the same as the corresponding components in FIGS. 6, 7, and 8.

The reference signal generation unit 138 includes one transistor NM4 and one current source CS4. As a result, the example embodiment shown in FIG. 9 can be implemented with a simpler configuration and reduces power consumption in comparison with those of FIGS. 6, 7, and 8.

In the described embodiments of the present invention, the preamplifier circuits may eliminate offsets of the preamplifiers by calibrating the reference signals of the preamplifiers. Thus, an output resistance may be reduced, and a precise signal may be detected. While the example embodiments of the present invention and their advantages have been described in detail, it should be understood that various changes, substitutions and alterations may be made herein without departing from the scope of the invention.

What is claimed is:

1. A preamplifier circuit comprising:
   a plurality of differential amplifiers, each differential amplifier configured to compare at least one input signal pair to at least one reference signal pair, and to generate at least one output signal pair;
   an offset detection circuit configured to detect an offset of the at least one output signal pair, and to generate at least one calibration signal responsive to the detected offset; and
   a reference circuit configured to adjust the at least one reference signal pair responsive to the at least one calibration signal.

2. The preamplifier circuit of claim 1, wherein each of the plurality of differential amplifiers comprises:
   a first differential comparator configured to compare one signal of one of the input signal pairs with one signal of one of the reference signal pairs; and
   a second differential comparator configured to compare another signal of the one of the input signal pairs with another signal of the one of the reference signal pairs.

3. The preamplifier circuit of claim 2, wherein the reference circuit operates according to at least one of a normal mode and an offset calibration mode.

4. The preamplifier circuit of claim 3, wherein during the offset calibration mode, two signals of the at least one input signal pair are set to a substantially identical level.

5. The preamplifier circuit of claim 1, wherein the offset detection circuit comprises:
   a multiplexer configured to select one of the output signal pairs responsive to at least one selection signal; and
   a calibration circuit configured to adjust the at least one calibration signal responsive to a logic state of the one of the output signal pairs.

6. The preamplifier circuit of claim 5, wherein the calibration circuit comprises:
   a comparator configured to receive and to amplify the one of the output signal pairs;
   a counter configured to adjust a count value responsive to the one of the amplified output signal pairs; and
   a plurality of registers configured to store the count value of the counter, and configured to output the at least one calibration signal corresponding to the stored count value.

7. The preamplifier circuit of claim 6, wherein the counter is configured to increase the count value when the one of the amplified output signal pairs of the comparator is in a first state, and configured to stop increasing the count value when the one of the amplified output signal pairs of the comparator transitions from the first state to a second state, the second state being a logic state substantially opposite to the first state.

8. The preamplifier circuit of claim 7, wherein the first state is a high logic state, the second state is a low logic state, and the counter is configured to adjust the count value responsive to a clock signal.

9. The preamplifier circuit of claim 3, wherein the reference circuit comprises:
   a plurality of resistors coupled between a first power voltage and a node, and configured to provide a plurality of divided voltage signals;
   a current source coupled between the node and a second power voltage; and
   a multiplexer configured to select one of the divided voltage signals as a first signal of the at least one reference signal pair responsive to the at least one calibration signal.

10. The preamplifier circuit of claim 9, wherein a second signal of the at least one reference signal pair is set to a substantially medium level among the divided voltages selectable as the first signal of the at least one reference signal pair.

11. The preamplifier circuit of claim 9, wherein the reference circuit further comprises a switch configured to select a second signal of the at least one reference signal pair.

12. The preamplifier circuit of claim 11, wherein during the offset calibration mode, the switch selects the second signal of the at least one reference signal pair to have a substantially medium level among the divided voltages selectable as the first signal of the at least one reference signal pair.

13. The preamplifier circuit of claim 11, wherein during the normal mode, the switch selects the second signal of the at least one reference signal pair to be one of a substantially low level voltage and a substantially high level voltage.

14. The preamplifier circuit of claim 1, wherein the reference circuit comprises:
   a plurality of resistors coupled between a first power voltage and a node, and configured to provide a plurality of divided voltage signals, each voltage signal being grouped into one of high, medium, and low voltage levels;
   a current source coupled between the node and a second power voltage;
   a first multiplexer configured to select from the high voltage level group to determine a first signal of a first reference signal pair;
   a second multiplexer configured to select from the medium voltage level group to determine a first signal of a second reference signal pair;
   a third multiplexer configured to select from the low voltage level group to determine a first signal of a third reference signal pair;
   a first switch configured to select one of a substantially high voltage level and a substantially low voltage level to determine a second signal of the third reference signal pair; and
   a second switch configured to select one of a substantially high voltage level and a substantially low voltage level to determine a second signal of the first reference signal pair.

15. The preamplifier circuit of claim 14, wherein a second signal of the second reference signal pair is set to a substantially medium voltage level.

16. The preamplifier circuit of claim 15, wherein the first switch is configured to select the substantially high voltage level during a normal mode, and to select the substantially low voltage level during an offset calibration mode.

17. The preamplifier circuit of claim 15, wherein the second switch is configured to select the substantially high voltage level during an offset calibration mode, and to select the substantially low voltage level during a normal mode.

18. A method for calibrating an offset in a preamplifier circuit, comprising:
   providing at least one input signal pair to a plurality of differential amplifiers;
   providing at least one reference signal pair to the plurality of differential amplifiers;
   generating at least one output signal pair responsive to the at least one input signal pair and responsive to the at least one reference signal pair;
   comparing signals of each of the at least one output signal pair to detect an offset during an offset detection mode;
   generating at least one calibration signal responsive to the comparison; and
   adjusting the at least one reference signal pair responsive to the at least one calibration signal.

19. The method of claim 18, wherein generating the at least one calibration signal comprises:
   providing a plurality of divided voltage signals;
   selecting a first signal of the at least one reference signal pair among the divided voltage signals;
   setting a second signal of the at least one reference signal pair to a medium level among the divided voltages selectable as the first signal of the at least one reference signal pair;
   adjusting the first signal of the at least one reference signal pair when the at least one output signal pair is in a first state; and
   stopping the adjustment of the first signal when the at least one output signal pair transitions from the first state to a second state, the second state being a logic state substantially opposite to the first state.

20. The method of claim 18, further comprising setting two signals of each of the at least one input signal pair to a substantially identical level.

21. The method of claim 18, further comprising calibrating the at least one output signal pair in a multi-level pulse amplitude modulation (PAM).

22. The method of claim 21, wherein the multi-level pulse amplitude modulation (PAM) is a four-level pulse amplitude modulation (4-PAM).

23. A method for calibrating an offset in a preamplifier circuit, comprising:
   providing at least one input signal pair to a plurality of differential amplifiers;
   providing at least one reference signal pair to the plurality of differential amplifiers;
   generating at least one output signal pair responsive to the at least one input signal pair and responsive to the at least one reference signal pair;
   comparing signals of each of the at least one output signal pair to detect an offset during an offset detection mode;
   generating at least one calibration signal responsive to the comparison; and adjusting the at least one reference signal pair responsive to the at least one calibration signal,
   wherein generating the at least one calibration signal comprises providing a plurality of divided voltage signals.

24. The method of claim 23, wherein generating the at least one calibration signal further comprises:
   selecting a first signal of the at least one reference signal pair among the divided voltage signals; and
   setting a second signal of the at least one reference signal pair to as medium level among the divided voltages selectable as the first signal of the at least one reference signal pair.

25. The method of claim 24, wherein generating the at least one calibration signal further comprises:
   adjusting the first signal of the at least one reference signal pair when the at least one output signal pair is in the first state; and
   stopping the adjustment of the first signal when the at least one output signal pair transitions from the first state to a second state, the second state being a logic state substantially opposite to the first state.

* * * * *

UNITED STATES PATENT AND TRADEMARK OFFICE
CERTIFICATE OF CORRECTION

PATENT NO. : 7,535,293 B2  Page 1 of 1
APPLICATION NO. : 11/679802
DATED : May 19, 2009
INVENTOR(S) : Young-Chan Jang It is certified that error appears in the above-identified patent and that said Letters Patent is hereby corrected as shown below:

Column 4, line 46, the word "MS" should read -- M5 --;
Column 5, line 19, the word "CNTF" should read -- CNT --;
Column 6, line 24, the word "maybe" should read -- may be --;
Column 12, line 8, the word "as" should read -- a --;
Column 12, line 14, the words "the first" should read -- a first --.

Signed and Sealed this

Twenty-second Day of September, 2009

David J. Kappos
*Director of the United States Patent and Trademark Office*